(12) United States Patent
Tudman et al.

(10) Patent No.: US 12,137,524 B2
(45) Date of Patent: Nov. 5, 2024

(54) APPARATUS, SYSTEM, AND METHOD OF PROVIDING A CIRCUIT BOARD CARRIER FOR A PICK AND PLACE SYSTEM

(71) Applicant: JABIL INC., St. Petersburg, FL (US)

(72) Inventors: Mark Tudman, St. Petersburg, FL (US); Vincy Li, St. Petersburg, FL (US); Rayce Loftin, St. Petersburg, FL (US)

(73) Assignee: JABIL INC.

( * ) Notice: Subject to any disclaimer, the term of this patent is extended or adjusted under 35 U.S.C. 154(b) by 642 days.

(21) Appl. No.: 17/605,528

(22) PCT Filed: Dec. 19, 2019

(86) PCT No.: PCT/US2019/067456
§ 371 (c)(1),
(2) Date: Oct. 21, 2021

(87) PCT Pub. No.: WO2020/142235
PCT Pub. Date: Jul. 9, 2020

(65) Prior Publication Data
US 2022/0210959 A1    Jun. 30, 2022

Related U.S. Application Data

(60) Provisional application No. 62/788,517, filed on Jan. 4, 2019.

(51) Int. Cl.
*B25B 11/00* (2006.01)
*H05K 13/00* (2006.01)
(52) U.S. Cl.
CPC ..... *H05K 13/0015* (2013.01); *H05K 13/0069* (2013.01)

(58) Field of Classification Search
CPC ....... B25B 11/00; B25B 11/02; B25B 11/005; H05K 13/0016; B23Q 3/00; B23Q 3/06; B23Q 3/152
See application file for complete search history.

(56) References Cited

U.S. PATENT DOCUMENTS 3,048,059 A * 8/1962 Cross .................. B23Q 16/065
74/819
3,972,100 A 8/1976 Zemek
(Continued)

FOREIGN PATENT DOCUMENTS

CN    202178938    3/2012
CN    202979578    6/2013
(Continued)

OTHER PUBLICATIONS

International Search Report for PCT/US2019/067456, dated Oct. 19, 2018.
(Continued)

*Primary Examiner* — Lee D Wilson
(74) *Attorney, Agent, or Firm* — Riverside Law LLP

(57) ABSTRACT

The disclosure is and includes at least an apparatus, system and method for a rotary table suitable to receive surface mount technology (SMT) components onto a circuit board associated therewith. The apparatus, system and method may include a frame suitable for insertion into a pick and place machine, and having a receiving inset therein; a fixture suitable for removable insertion to the receiving inset; a plurality of roller bearings interactively associated with the fixture, and which impart a low friction roll to at least a perimeter portion of the fixture; and at least one guide on the frame suitable to at least partially positional maintain the circuit board associated with the fixture.

18 Claims, 7 Drawing Sheets

(56) References Cited

U.S. PATENT DOCUMENTS

| | | | |
|---|---|---|---|
| 4,080,730 | A | 3/1978 | Woodman, Jr. |
| 4,574,660 | A | 3/1986 | Kaminsky |
| 5,240,746 | A | 8/1993 | O'Connell Litteral |
| 6,000,123 | A | 12/1999 | Munezane |
| 6,299,153 | B1 * | 10/2001 | Meron .............. H01L 21/68728 451/365 |
| 6,328,296 | B2 * | 12/2001 | Tyveleijn .......... H01L 21/68728 269/297 |
| 6,536,755 | B2 * | 3/2003 | Meron .............. H01L 21/68721 451/365 |
| 6,607,427 | B2 * | 8/2003 | Togawa .................. B24B 37/04 451/443 |
| 6,656,028 | B2 * | 12/2003 | Chokshi ............ H01L 21/67772 451/28 |
| 6,783,299 | B2 * | 8/2004 | Meron .............. H01L 21/68728 403/325 |
| 7,306,509 | B2 * | 12/2007 | Hoshino ............... B24B 37/042 451/28 |
| 9,346,151 | B2 * | 5/2016 | Di Stefano ....... H01L 21/67333 |
| 10,573,541 | B2 * | 2/2020 | Stone ................ H01L 21/67259 |

FOREIGN PATENT DOCUMENTS

| | | |
|---|---|---|
| CN | 203870041 | 10/2014 |
| CN | 207196245 | 4/2018 |
| CN | 108208885 | 6/2018 |
| CN | 207948018 | 10/2018 |
| JP | 2001217596 A | 8/2001 |
| JP | 2013118387 A | 5/2013 |
| JP | 2015141413 A | 8/2015 |
| SU | 1173578 | 8/1985 |

OTHER PUBLICATIONS

Written Opinion of the International Searching Authority for PCT/US2019/067456, dated Apr. 22, 2020.

International Preliminary Report on Patentability for PCT/US2019/067456, dated Jun. 16, 2021.

Chinese Office Action issued in App. No. CN20198091189, dated Mar. 3, 2022, 7 pages.

Chinese Office Action issued in App. No. CN20198091189, dated Sep. 6, 2022, 7 pages.

* cited by examiner

APPARATUS, SYSTEM, AND METHOD OF PROVIDING A CIRCUIT BOARD CARRIER FOR A PICK AND PLACE SYSTEM

CROSS-REFERENCE TO RELATED APPLICATIONS

The present application claims benefit to International Application No. PCT/US2019/067456, filed Dec. 19, 2021, entitled: "Apparatus, System, and Method of Providing a Circuit Board Carrier for a Pick and Place System, which claims benefit of priority to U.S. Provisional Application No. 62/788,517, filed Jan. 4, 2019, entitled: "Apparatus, System and Method of Providing a Circuit Board Carrier for an Underfill System," the entirety of which is incorporated herein by reference as if set forth in its entirety.

BACKGROUND

Field of the Disclosure

The disclosure relates generally to circuit board manufacturing, and, more particularly, to an apparatus, system, and method of providing for pick and place on large without multiple passes circuit boards.

Background of the Disclosure

Surface mount technology (SMT) is a technology used to create completed printed circuit boards (PCBs). Typically, a circuit board substrate receives a plurality of traces thereon, and thereafter the SMT components are mounted to the surface of the PCB in a manner that provides conductivity through the traces between the SMT components, thereby providing a plurality of complete circuits in which the SMT components can operate.

SMT component placement systems, commonly called "pick-and-place', or "P&P", machines, are generally electromechanical/robotic machines used to place SMT components onto the PCB. Such pick and place machines are often used for high speed, high precision placement of a broad range of electronic components, such as capacitors, resistors, transistors, and integrated circuits (ICs) onto the PCB. After placing of components, the PCB may be used in a computer, a consumer electronic, or industrial, medical, automotive, military and telecommunications equipment. Similar pick and place machines are also used for so-called "through hole" components, which are placed within mounting holes in the PCB, and which are thereafter mounted to the PCB.

A pick and place machine may use several sub-systems to work together to pick up and correctly place the SMT or through-hole components onto the PCB. These systems may use pneumatic suction cups or grips on the robotic arms of the machine to seize the components to be placed, wherein these cups or grips may be attached to a plotter-like device that allows the cups or grips to be accurately manipulated in three dimensions.

The SMT components are typically provided along the front, back, and/or side faces of the machine to allow for seizure, and ultimately placement, by the robotic arms. The components may be supplied on paper or plastic tape, for example, and may be on tape reels that are loaded onto feeders mounted to the pick and place machine. Larger (ICs) may be arranged in trays which are stacked in a compartment of the machine, and more typically-sized ICs may be arranged in tapes as discussed above.

Blank PCBs may pass into the pick and place machine, and each PCB is then serially clamped in order to be subjected to the cups/nozzles and robotic arms, which pick up the individual SMT components from the feeders/trays, rotate them to the correct orientation, and then place them on the appropriate pads on the PCB with high precision. However, pick and place is typically limited to relatively small boards, so as to minimize the need for multiple robots and/or the need to repeatedly manually rotate or otherwise reorient the board to enable repeated pick and place passes over larger boards upon each reorientation. Some larger scale boards are subjected to pick and place, but placement of components as and if the board is repeatedly manually rotated over multiple passes in such circumstances greatly adds to the complexities and errors in board assembly. Such larger boards may be, by way of non-limiting example, those circuit boards having a diameter of greater than 34 inches.

SUMMARY OF THE DISCLOSURE

The disclosure is and includes at least an apparatus, system and method for a rotary table suitable to receive surface mount technology (SMT) components onto a circuit board associated therewith. The apparatus, system and method may include a frame suitable for insertion into a pick and place machine, and having a receiving inset therein; a fixture suitable for removable insertion to the receiving inset; a plurality of roller bearings interactively associated with the fixture, and which impart a low friction roll to at least a perimeter portion of the fixture; and at least one guide on the frame suitable to at least partially positional maintain the circuit board associated with the fixture. The fixture may rotate across the plurality of roller bearings to thereby rotate the circuit board about the receiving inset, and the rotation may variably associate radial aspects of the circuit board in proximity to at least one pick and place robot capable of placing ones of the SMT components upon the circuit board particularly within specific ones of the radial aspects.

BRIEF DESCRIPTION OF THE DRAWINGS

The disclosure is illustrated by way of example and not limitation in the accompanying drawings, in which like references may indicate similar elements, and in which.

DETAILED DESCRIPTION

Figure 1:
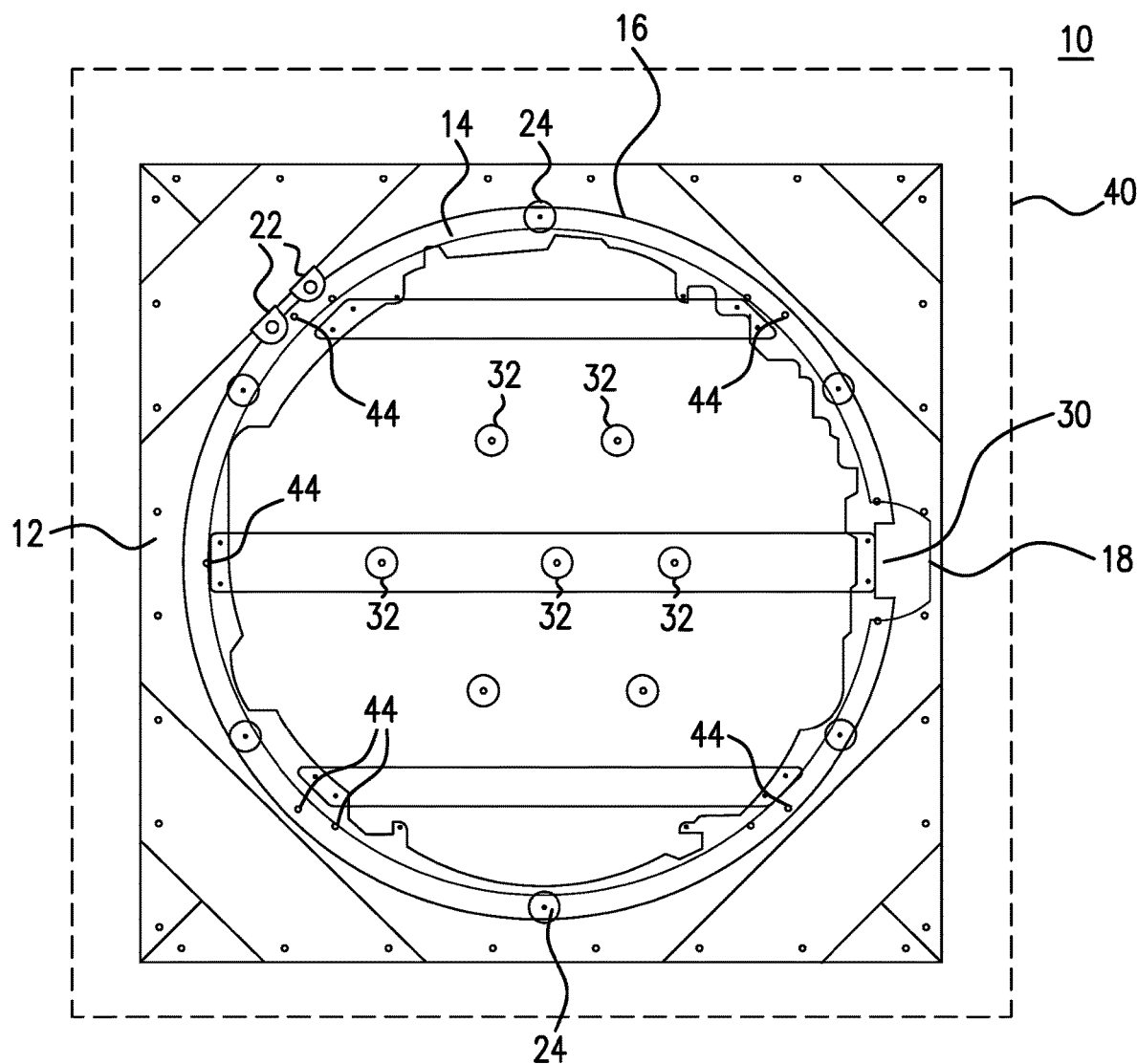
FIG. 1 illustrates an embodiment of an SMT rotary table.

The figures and descriptions provided herein may have been simplified to illustrate aspects that are relevant for a clear understanding of the herein described devices, systems, and methods, while eliminating, for the purpose of clarity, other aspects that may be found in typical similar devices, systems, and methods. Those of ordinary skill may recognize that other elements and/or operations may be desirable and/or necessary to implement the devices, systems, and methods described herein. But because such elements and operations are well known in the art, and because they do not facilitate a better understanding of the present disclosure, a discussion of such elements and operations may not be provided herein. However, the present disclosure is deemed to inherently include all such elements, variations, and modifications to the described aspects that would be known to those of ordinary skill in the art.

The terminology used herein is for the purpose of describing particular example embodiments only and is not intended to be limiting. For example, as used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc., may be used herein to describe various elements, components, regions, layers and/or sections, these elements, components, regions, layers and/or sections should not be limited by these terms. These terms may be only used to distinguish one element, component, region, layer or section from another element, component, region, layer or section. That is, terms such as "first," "second," and other numerical terms, when used herein, do not imply a sequence or order unless clearly indicated by the context. Thus, a first element, component, region, layer or section discussed below could be termed a second element, component, region, layer or section without departing from the teachings of the exemplary embodiments.

Processor-implemented modules, systems and methods of use are disclosed herein that may provide access to and transformation of a plurality of types of digital content, including but not limited to video, image, text, audio, metadata, algorithms, interactive and document content, and which track, deliver, manipulate, transform, transceive and report the accessed content. Described embodiments of these modules, systems and methods are intended to be exemplary and not limiting. As such, it is contemplated that the herein described systems and methods may be adapted and may be extended to provide enhancements and/or additions to the exemplary modules, systems and methods described. The disclosure is thus intended to include all such extensions.

As discussed above, larger scale wafer processing may be most readily accomplished if the subject circuit board is repeatedly rotated through multiple passes to allow for pick and place operations. However, such board rotation has generally added great complexity to the pick and place process, at least because of the need to very precisely maintain an awareness of board positioning to allow for refined placement of, for example, SMT components.

A rotary table is a precision work positioning device often used in metalworking. It enables drilling, cutting, and component placement at exact radial intervals around a fixed axis—typically a fixed center vertical axis. A rotary table may be manually or automatically operated. That is, a rotating aspect of the table to which the work item is clamped, clipped, or otherwise temporarily attached may rotate freely, may be indexed, i.e., positionally tracked, in an automated manner, or may rotate under manual control, such as under the control of a handwheel attached to a worm gear.

The workpiece must be accurately centered on the rotary table's center vertical axis, which must, in turn, be centered with the working tool's axis, thereby making the axes coaxial. This allows concentric and radial machining operations on the workpiece, as long as the tool axis and the workpiece axis remain coaxial. Of course, such refined coaxiality is exceedingly difficult to maintain if the workpiece is moved, such as by rotation of the rotary table.

It has been proposed that tables similar to a rotary table be used in pick and place operations for SMT components onto circuit boards, such as large form factor circuit boards. However, for large form factor circuit boards, and particularly for circuit boards that may be subjected to automated placement by multiple pick and place robots traversing multiple paths, the identification of the board's current location, and more particularly the location of each radial slice of the board, in space, and consequently, the precise location at which each component is to be placed on the board, becomes exceedingly difficult if the board is repeatedly moved.

In the foregoing instances, highly complex programming, and hence very significant processing resources, are typically required in order to identify aspects of the board upon which SMT components are to be placed, and to continuously process a mapping of those aspects, such that the precise location for the pick and place robotics can be ascertained at all times. In the known art, it is typical that this board positional assessment for pick and place is made using a single fiducial provided in association with the board, which further increases the computing necessary to maintain positional knowledge. This computing is necessary at least so as to avoid misplacement of components on the board, and further to avoid catastrophic process and/or machine breakdown.

The embodiments combine at least the aforementioned mechanical rotary tables known in the art with SMT pick and place machines to provide an SMT rotary table. That is, a table suitable to rotate a circuit board placed thereon at least through 180 degrees, either by a manual or an automated rotation, while readily allowing for a maintained knowledge of board position with minimal computing, is provided by the disclosure. This rotation enables the placement onto the circuit board associated with the rotary table of at least SMT and/or through-hole components, herein collectively referred to as SMT components.

The apparatus, system and method for providing an SMT rotary table disclosed herein may enable population of large form factor circuit boards in a single pass by a pick and place machine. Such boards may include those circuit boards having a diameter an excess of 34 inches.

The disclosed SMT rotary table may also allow for disassociation of board handling from known pick and place processes, and may further at least partially eliminate the need for a several manual operators to load, unload, and repeatedly rotate a circuit board associated with a pick and place process. That is, the rotary table of the embodiments may allow for manual rotation of a board associated with the disclosed SMT rotary table by a single manual operator, such as using evident fiducials to mark board locations.

Additionally and alternatively, the embodiments may include an automated, indexed rotation of the board, such as wherein the automated rotation may be periodic, such as quadrant by quadrant; semi-continuous, such as with periodic stoppages in the rotation; or continuous, such as wherein the board is automatically rotated at a predetermined rate. The automated rotation of the board by the SMT rotary table disclosed may be controlled by one or more board-matched pick and place processing programs executed by a processing system. By way of non-limiting example, the processing system may oversee both the pick and place machine operations and the rotation of the SMT rotary table, as discussed hereinbelow.

As referenced above, known pick and place machines suitable for the placement of SMT components generally require, for larger circuit boards, that operators manually remove the circuit board from the pick and place machine, rotate or reorient the board, and then manually reload to the circuit board into the pick and place machine in the proper position to allow for continuation of the placement of the SMT components onto the board. This must be done without disturbing or destroying previously placed SMT components, and while ensuring placement of the SMT components into proper position on the relevant circuit trace on the circuit board. Because the disclosed embodiments may significantly reduce or eliminate manual handling of the circuit board, particularly for larger circuit boards, such as those weighing 35 pounds or more, the disclosed embodiments may eliminate human error in reorientation of the board, and/or damage caused by droppage or mishandling of circuit boards. As such, not only does the disclosed SMT rotary table allow for component placement with less or no manual interaction, the disclosed embodiments may also significantly enhance processing times and yields for circuit boards prepared using the embodiments.

Accordingly, the entire surface of a large format circuit board may be populated by a pick and place machine in a single pass, via/or using a single pick and place program, without removal of the board from the pick and place process to reorient the board, and, in some embodiments, without manual interaction with the circuit board. Justification, indexing, and alignment of the rotary table and the circuit board thereon may be accomplished using known techniques, such as indexing of the board during a pass within the pick and place machine tied to sensors providing location indications to a pick and place processing system. Sensing may include, for example, optical sensing of fiducials and/or the use of locating pins on or in association with a frame or frame fixture placed within the disclosed rotary table and which holds the processed board.

As discussed throughout, table/board/board frame/frame fixture rotation may be accomplished manually or automatically, and in either case this rotation allows for the circuit board to remain inside the pick and place machine for SMT population in a single pass, thereby diminishing or eliminating mishandling or improper orientation risks. More particularly, automated rotations of the board, as discussed throughout, may be handled pneumatically, electromechanically, or hydraulically, such as by a motor and associated gearing, by way of non-limiting example. The use of automated rotation may, as discussed throughout, eliminate cycle times, labor, and may reduce capacity requirements.

FIG. 1 illustrates a schematic diagram of an exemplary rotary table 10 in accordance with the embodiments. In the illustration, the board holding frame 12 shown is rectangular in shape, although the skilled artisan will appreciate in light of the discussion herein that other shapes and sizes for the table frame may be provided. The frame 12 may receive therewithin, such as at an inset 14 thereof, a frame fixture 16 that includes one or more locations thereon that allow for grasping and/or rotation of a circuit board 18 associated with the rotary table 10. The skilled artisan will appreciate that grasping of circuit board 18 can be accomplished in many forms, such as to accommodate odd shaped features of any circuit board 18. As to rotation, the frame fixture 16 may rotate within its inset 14 while mounted in inset 14 within the table frame 12 while holding the circuit board 18 thereon, or the frame fixture 16 may be received within an inset 14 of the table frame 12 and may itself allow for independent rotation of a circuit board 18 placed within/upon the fixture.

For example, roller bearings 22 may be associated with a circuit board 18 placed within the fixture 16, or may reside on the table frame 12 for association with the frame fixture 16 once the fixture 16 is within its inset 14, as discussed further below, to allow for effective rotation of the circuit board 18. Moreover, one or more fixation points or stopping points 44 for the circuit board 18 or the frame fixture 16 may be associated with the roller bearing locations, or may be provided as separate circuit board clamps 24, either on the frame extending over or to the frame fixture 16 and/or the circuit board 18, or on the frame fixture 16, as shown in the illustrations throughout.

Additionally provided within the table frame 12 and/or the frame fixture 16 within the table frame 12 may be one or more cutouts, such as to provide handles 30 to enable a manual operator to grasp one or more portions of the circuit board 18 associated with the table frame 12 and frame fixture 16. Also illustrated may be one or more support points 32 for a circuit board 18 placed within the table frame 12 and frame fixture 16, wherein such supports 32 may comprise, by way of non-limiting example, pins for association with an underside of the circuit board 18 in order to hold the circuit board 18 at a height suitable for placement of SMT components thereon by a pick and place machine 40 into which the rotary table 10 is inserted.

Also shown are one or more indexing pins 44, such as may provide to a processing system or a manual operator indexing of locations along the circuit board 18. The indexing of these locations may be indicated by one or more sensed fiducials, and may be provided in order to properly assess orientation and location information of a circuit board 18 placed within the frame fixture 16.

Needless to say, other aspects may be associated with the frame and fixture(s), such as additional circuit board supports, locking and/or clamp mechanisms, and so on. Such supports, clamps, locking mechanisms, or the like may be manually actuated, or may be electrically actuated, such as by the processing system discussed herein in association with a particular pick and placement program.

Figure 2:
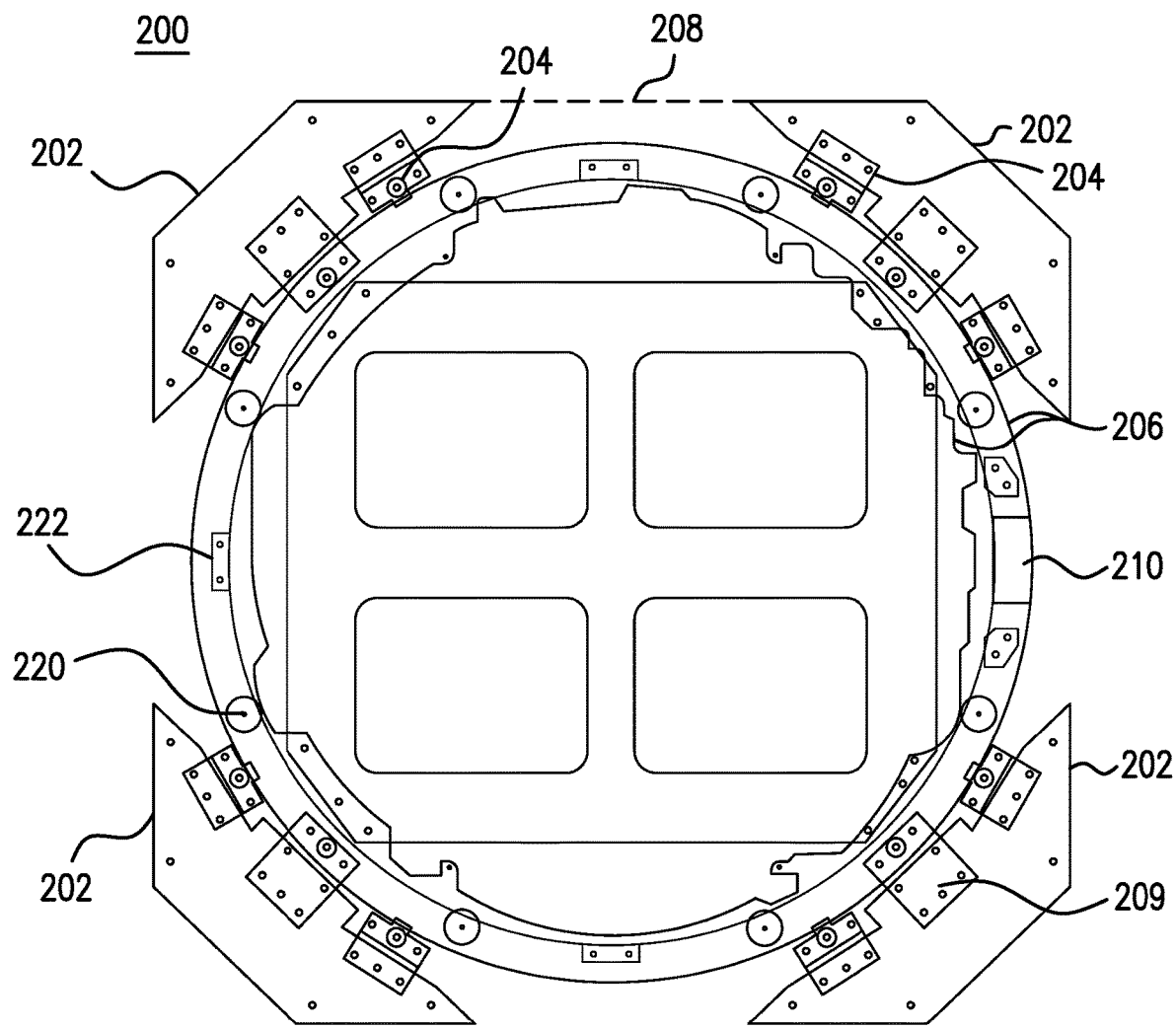
FIG. 2 illustrates aspects of a fixture and frame of an SMT rotary table.

FIG. 2 illustrates features similar to those illustrated in FIG. 1. More particularly, FIG. 2 illustrates four bearing plates 202 that may include thereon one or more roller bearing mechanisms 204 to allow for rotation of a fixture 206 within a frame 208, and/or one or more locking or clamping and guide mechanisms 209 to freeze and/or maintain a circuit board 210 in the fixture 206 in a particular position. It will be appreciated in light of the illustration of FIG. 2 that such roller bearing plates 202 may be modular, i.e., may be removable from the frame 208 in the embodiments shown, such as in order to allow for different bearing plates 202 to be placed into the frame 208 to receive different fixtures 206 for different circuit boards 210, which may be required to enable the rotary table 200 to perform its functions for circuit boards 210 of varying shape, size, or the like.

Figure 3:
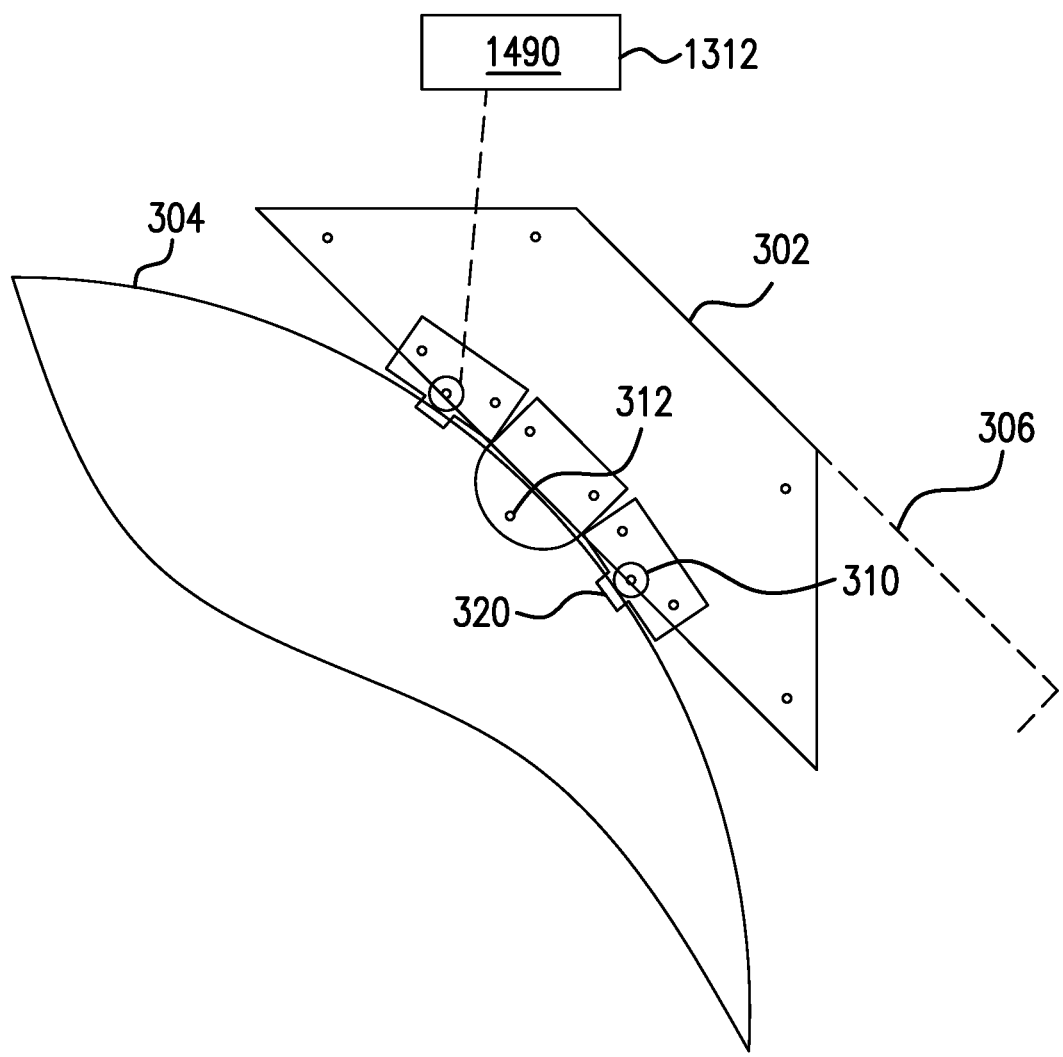
FIG. 3 illustrates aspects of a fixture and frame of an SMT rotary table.

Also shown in the illustration of FIG. 2, up to or more than eight clamps 220 may be associated with positionally maintaining the fixture 206 and/or a circuit board 210 placed onto fixture 206 within the frame 208. Yet further, multiple guides 222 may be provided that may passively support proper positioning and rotation of the circuit board 210, such as on fixture 206. Moreover, although support pins and indexing pins are not shown in the illustration of FIG. 2, it will be understood that such support pins and indexing pins or similar circuit board support and/or sensing mechanisms may be provided in the embodiments. Such circuit board supports may be specifically corresponded to certain circuit boards. That is, the circuit board support provided by the fixture 206 of the SMT rotary table 10 may provide support and/or sensing mechanisms in locations that will not interfere with active components/traces of the circuit board 210. This avoids damage to active portions of the circuit board 210 upon completion. FIG. 3 illustrates with greater particularity an exemplary rotary bearing plate 302 that may be removable, and that may be associated with the fixture 304 and/or a frame 306 of the disclosed SMT rotary table 10. In the illustrated embodiment, an upper bearing 310 is provided at either side of a circuit board guide 312. By way of example, the provided upper bearing 310 may rotate along the edge of the fixture 304, such as to allow manual rotation of the fixture 304 within the frame 306, and thus rotation of the circuit board 210, as the circuit board 210 is constrained by the circuit board guide(s) 312 illustrated.

Further, a lower bearing 320 may support the fixture 304 just inside the outer edge of the circuit board 210, and may additionally allow for rotation of the fixture 304 across an upper portion of the lower bearing 320. It will be understood that either or both of the upper and lower bearings 310, 320 illustrated may also be active rather than passive in certain embodiments, such as in automated rotational embodiments in which the processing system 1312, discussed herein, actively effectuates a rotation of the fixture 304 across the bearing or bearings 310, 320, or of the circuit board 210 within the fixture 304, pursuant to a particular pick and place program 1490, discussed herein.

Figure 4:
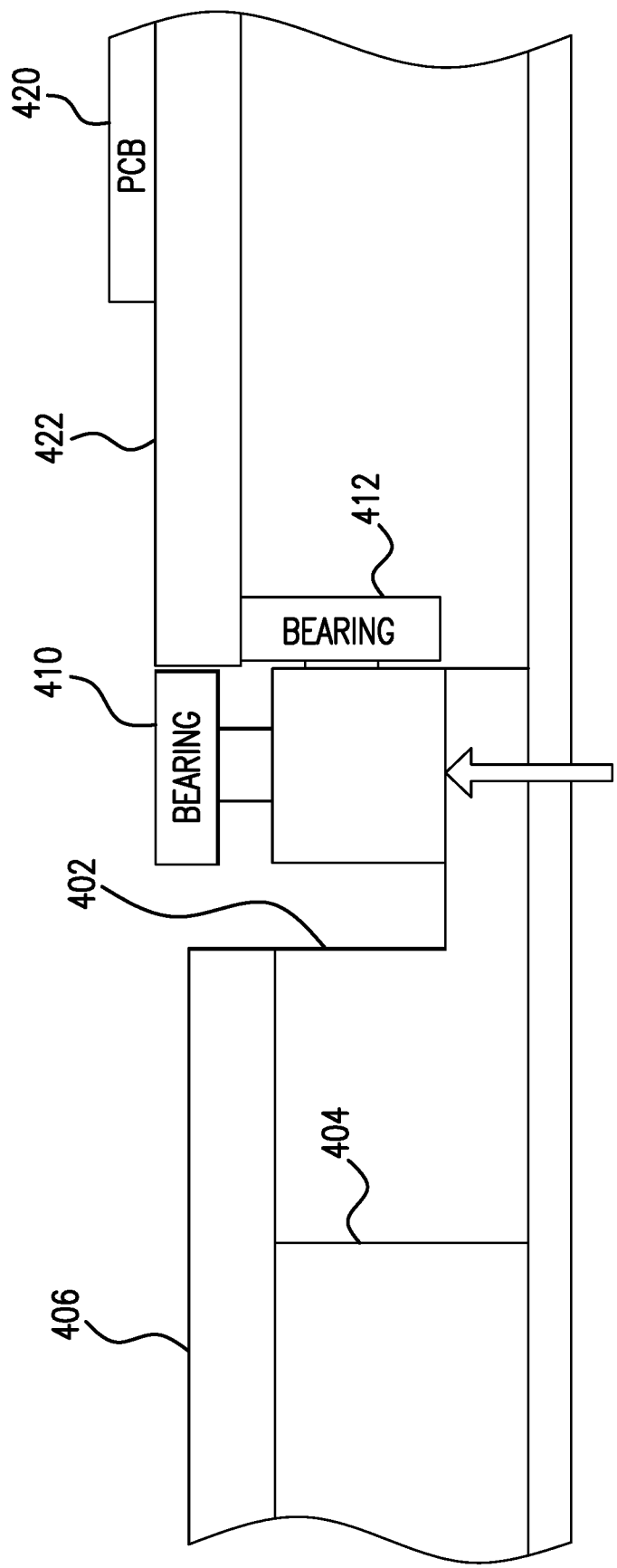
FIG. 4 illustrates aspects of a fixture and frame of an SMT rotary table.

An embodiment of a rotary bearing plate 402 is shown by way of illustration in FIG. 4. As illustrated, a modular roller bearing plate 402 may be inserted into a receiving frame adapter 404 of frame 406 removably. The roller bearing plate 402 thus modularly inserted may include an upper bearing 410 and lower bearing 412 as shown, which, as referenced above, may provide for rotation of either the circuit board 420 placed atop the lower bearing 412, or of the fixture 422 that supports the circuit board 420 upon the lower bearing 412.

Figure 5:
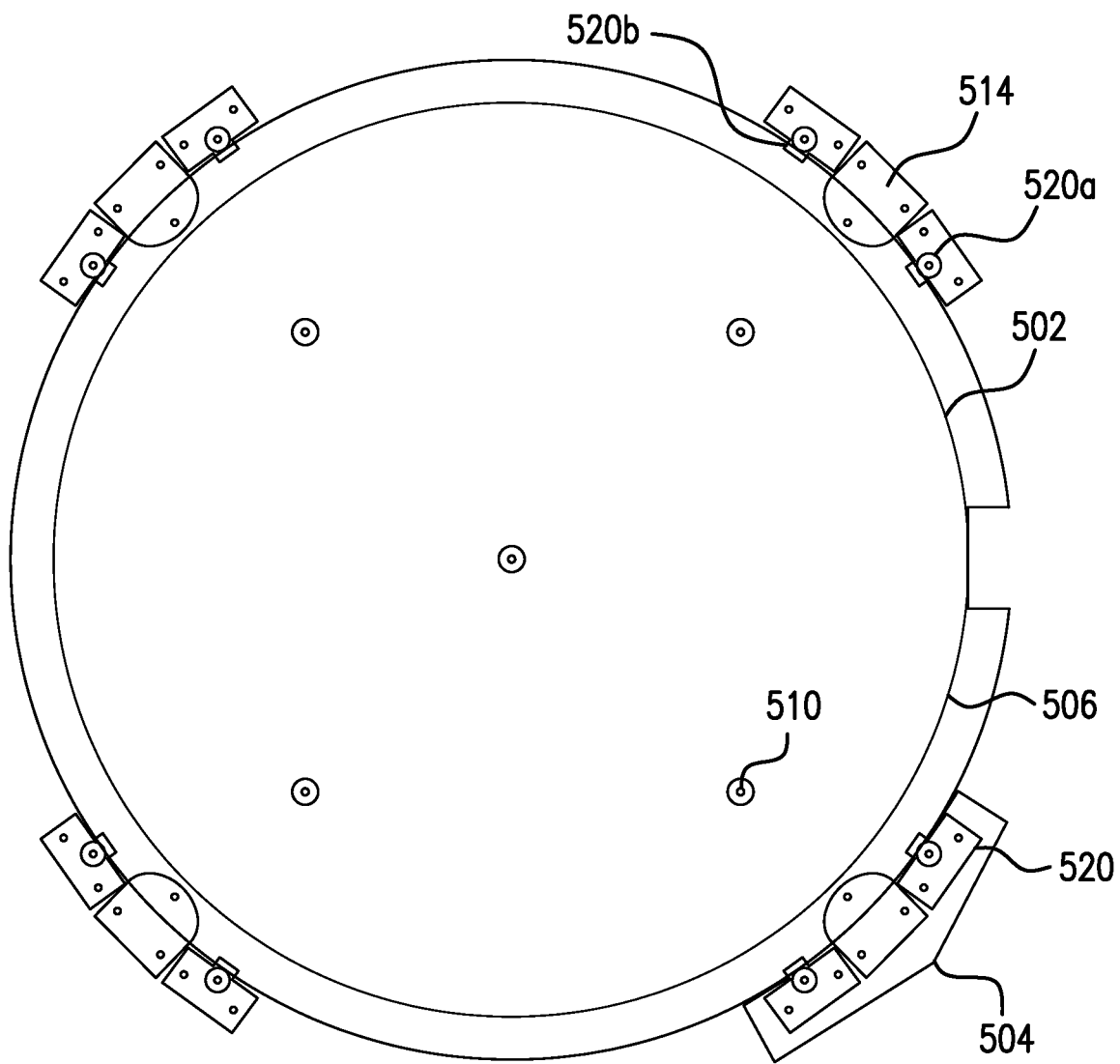
FIG. 5 illustrates aspects of a fixture and frame of an SMT rotary table.

FIG. 5 illustrates with greater particularity a fixture 502 associated with a modular roller bearing plate 504. As illustrated, the circuit board 506 is placed upon the fixture 502, such as wherein the fixture 502 provides one or more supports 510 that do not interfere with aspects of the circuit board 506, as discussed herein above. The fixture 502 may then be removably placed within a frame (not shown in FIG. 5) and/or otherwise associated with modular bearing plates 504, such as to place the circuit board 506 within the guides 514 provided along with the bearings 520 by the roller bearing plate 504. The upper and lower bearings 520a, 520b may, in such an example, allow for automated or manual rotation of the fixture 502 within the SMT rotary table frame, as discussed throughout, which, needless to say, allows for a rotation of the circuit board 506 as is also discussed throughout.

In accordance with the foregoing, it will be appreciated that the pick and place machine or SMT rotary table itself may have sensing capabilities suitable to positionally assess a circuit board associated with the frame discussed herein. Such sensing may be optical, radio frequency, infrared, or the like, and/or may be electromechanical, such as wherein physical contact with indexing pins by either a fixture having a circuit board associated therewith, or a circuit board associated with the discussed embodiments, may be assessed by sensing.

Figure 6:
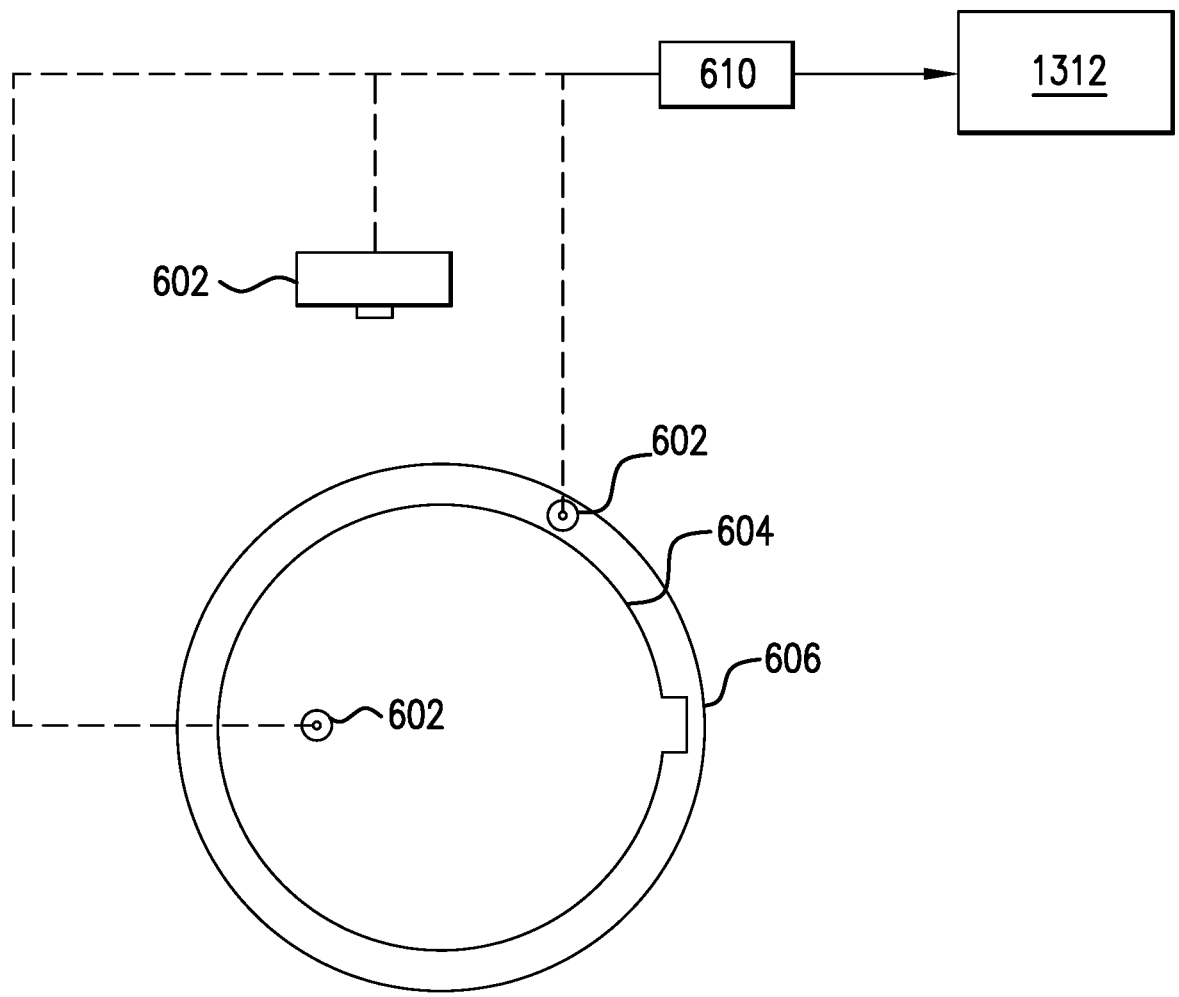
FIG. 6 illustrates aspects of positional sensing for a fixture and frame of an SMT rotary table.

More particularly, FIG. 6 illustrates the association of at least one sensor 602 with a system for viewing and positionally assessing the location of the circuit board 604 and/or the fixture 606 discussed herein. The sensor 602 may send the data 610 generated from the sensor 602 to the at least one processing system 1312. The sensor 602 may be, by way of nonlimiting example, an optical camera, an indexing pin, and/or a locating support pin.

The sensing, in conjunction with the processing by a processing system 1312, allows for digital assessment of radial aspects of the circuit board 604 to be subjected to the picking and placement of components onto the circuit board 604, as performed by the pick and place machine discussed herein. It will be appreciated that, in performance of the processes discussed herein, one or multiple robots may perform pick and place for any given radial aspect, either simultaneously or independently, without departing from the disclosure. For example, each radial aspect may, in association with one or more algorithms/applications 1490 executed by the processing system 1312, have an algorithmic pattern for the placement of low-profile components, and/or a second algorithmic pattern for placement of high-profile components, and these algorithmic patterns may be variably keyed to a board position as indicated by the sensor reading of the board position. That is, one robot may place the low-profile components, and another robot may place the high-profile components. Alternatively, to save on mechanical complexity of the pick and place machine 10, a single robot may use to place both types of components on the circuit board 604 These placements may be keyed algorithmically to the sensed board position, and may comprise a unique algorithm for each placement component(s) and location(s).

Each unique algorithm 1490a mentioned above may occur during execution of a single program 1490, such as for a particular board type and/or size, a particular component type placement, and/or a particular board rotation or reorientation, as discussed herein throughout. In relation to the foregoing example, the components may be placed in a staggered manner by being subjected to a first quadrant component placement program/algorithm 1490 for low-profile components in a first quadrant, and then the circuit board 604 may be automatically rotation to expose a second quadrant to the pick and place robot, so that a second high-profile component placement program/algorithm 1490 for high-profile components can be executed for that second quadrant, by way of non-limiting example.

In accordance with the foregoing, at least upon each reorientation of the subject circuit board 604, the sensor(s) may renew its viewing of the location of the circuit board 604, may send this data to the processing system 1312, and accordingly the processing system 1312, using application/program/algorithm 1490, may reassess the positions on the board before executing a placement aspect of program 1490. Of course, it will be appreciated in light of the discussion herein that location identification using sensor tracking may occur periodically, continuously, or may be performed only upon initial association of the circuit board 604 with the rotational table.

As referenced, the program 1490 of the processing system 1312, such as uniquely for each board as in the examples herein, may have multiple distinct subprograms assigned to rotate the board and to run in each respective radial board aspect in order to properly place different component types, such as low-profile and high-profile components. Thus, upon assessment by the sensor of the location of each radial aspect, the processing system 1312 may assess the presence of, or the need to rotate to, a particular aspect to be proximate to and underneath the at least one pick and place robot.

Figure 7:
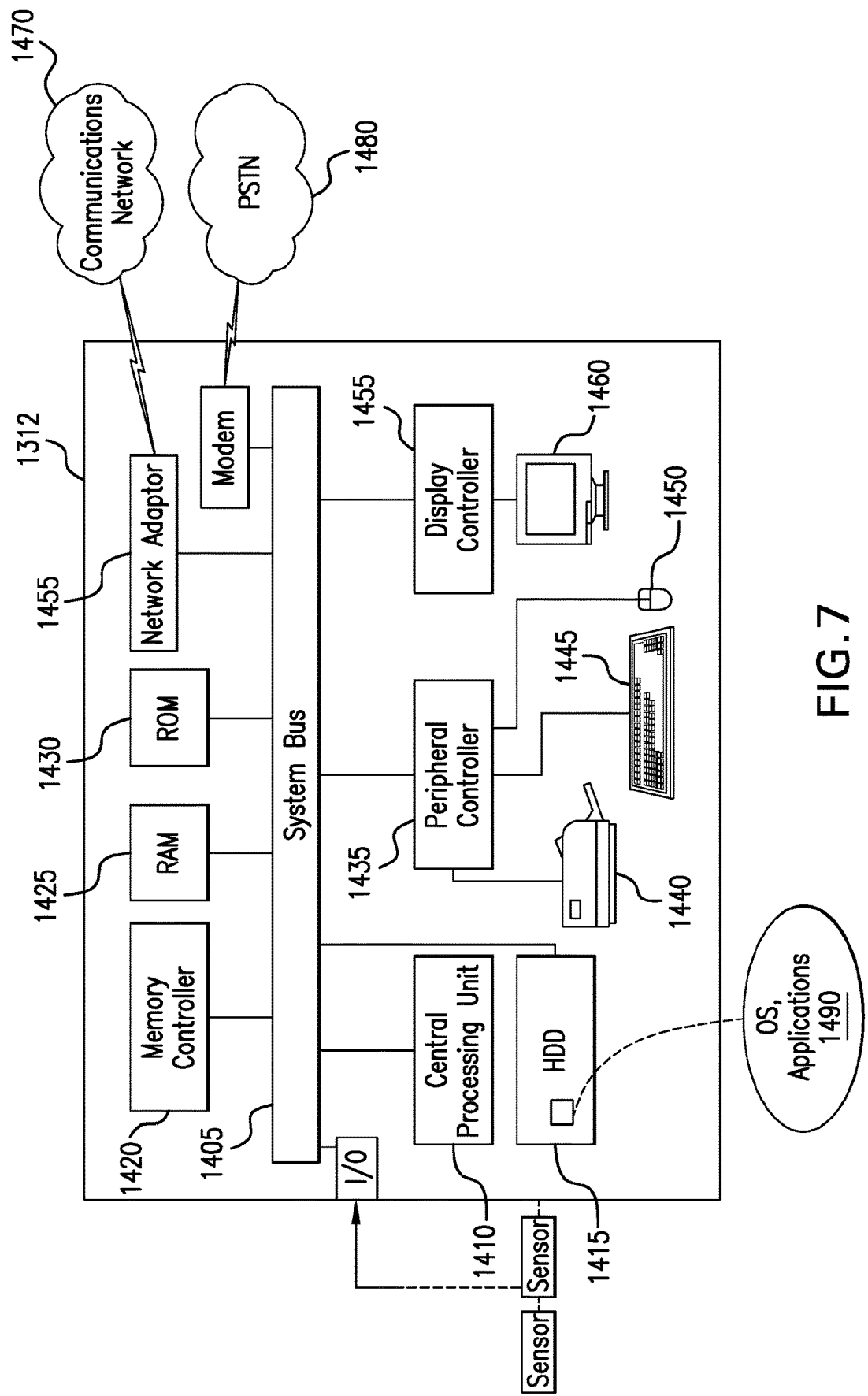
FIG. 7 illustrates a processing system.

FIG. 7 depicts an exemplary computer processing system 1312 for use in association with the embodiments, by way of non-limiting example. Processing system 1312 is capable of executing software, such as an operating system (OS), applications, user interface, and/or one or more other computing algorithms/applications 1490, such as the recipes, programs and subprograms discussed herein. The operation of exemplary processing system 1312 is controlled primarily by these computer readable instructions/code 1490, such as instructions stored in a computer readable storage medium, such as hard disk drive (HDD) 1415, optical disk (not shown) such as a CD or DVD, solid state drive (not shown) such as a USB "thumb drive," or the like. Such instructions may be executed within central processing unit (CPU) 1410 to cause system 1312 to perform the disclosed operations, comparisons and calculations. In many known computer servers, workstations, personal computers, and the like, CPU 1410 is implemented in an integrated circuit called a processor.

It is appreciated that, although exemplary processing system 1312 is shown to comprise a single CPU 1410, such description is merely illustrative, as processing system 1312 may comprise a plurality of CPUs 1410. Additionally, system 1312 may exploit the resources of remote CPUs (not shown) through communications network 1470 or some other data communications means 1480, as discussed throughout.

In operation, CPU 1410 fetches, decodes, and executes instructions from a computer readable storage medium, such as HDD 1415. Such instructions may be included in software 1490. Information, such as computer instructions and other computer readable data, is transferred between components of system 1312 via the system's main data-transfer path. The main data-transfer path may use a system bus architecture 1405, although other computer architectures (not shown) can be used.

Memory devices coupled to system bus 1405 may include random access memory (RAM) 1425 and/or read only memory (ROM) 1430, by way of example. Such memories include circuitry that allows information to be stored and retrieved. ROMs 1430 generally contain stored data that cannot be modified. Data stored in RAM 1425 can be read or changed by CPU 1410 or other hardware devices. Access to RAM 1425 and/or ROM 1430 may be controlled by memory controller 1420.

In addition, processing system 1312 may contain peripheral communications controller and bus 1435, which is responsible for communicating instructions from CPU 1410 to, and/or receiving data from, peripherals, such as peripherals 1440, 1445, and 1450, which may include printers, keyboards, and/or the operator interaction elements discussed herein throughout. An example of a peripheral bus is the Peripheral Component Interconnect (PCI) bus that is well known in the pertinent art.

Operator display 1460, which is controlled by display controller 1455, may be used to display visual output and/or presentation data generated by or at the request of processing system 1312, such as responsive to operation of the aforementioned computing programs/applications 1490. Such visual output may include text, graphics, animated graphics, and/or video, for example. Display 1460 may be implemented with a CRT-based video display, an LCD or LED-based display, a gas plasma-based flat-panel display, a touch-panel display, or the like. Display controller 1455 includes electronic components required to generate a video signal that is sent to display 1460.

Further, processing system 1312 may contain network adapter 1465 which may be used to couple to external communication network 1470, which may include or provide access to the Internet, an intranet, an extranet, or the like. Communications network 1470 may provide access for processing system 1312 with means of communicating and transferring software and information electronically. Additionally, communications network 1470 may provide for distributed processing, which involves several computers and the sharing of workloads or cooperative efforts in performing a task, as discussed above. Network adaptor 1465 may communicate to and from network 1470 using any available wired or wireless technologies. Such technologies may include, by way of non-limiting example, cellular, Wi-Fi, Bluetooth, infrared, or the like.

In the foregoing Detailed Description, it can be seen that various features are grouped together in a single embodiment for the purpose of clarity and brevity of the disclosure. This method of disclosure is not to be interpreted as reflecting an intention that the embodiments require more features than are expressly recited herein. Rather, the disclosure is to encompass all variations and modifications to the disclosed embodiments that would be understood to the skilled artisan in light of the disclosure.

What is claimed is:

1. A rotary table suitable to receive surface mount technology (SMT) components onto a circuit board associated therewith, comprising:
   a frame having a receiving inset therein;
   a fixture suitable for removable insertion to the receiving inset;
   a plurality of roller bearings interactively associated with the fixture, and which impart a low friction roll to at least a perimeter portion of the fixture; and
   at least one guide on the frame suitable to at least partially positional maintain the circuit board associated with the fixture;
      wherein the fixture rotates across the plurality of roller bearings to thereby rotate the circuit board about the receiving inset, and wherein the rotation variably associates radial aspects of the circuit board in proximity to at least one pick and place robot capable of placing ones of the components upon the circuit board particularly within specific ones of the radial aspects, wherein the rotation is manual and is responsive to a manual operator operating a handwheel attached to a worm gear.

2. The rotary table of claim 1, wherein the variable association is in a single pass.

3. The rotary table of claim 2, wherein the single pass is periodically actuated.

4. The rotary table of claim 2, wherein the single pass is substantially continuously actuated.

5. The rotary table of claim 1, wherein the plurality of roller bearings are passive.

6. A rotary table suitable to receive surface mount technology (SMT) components onto a circuit board associated therewith, comprising:
 a frame having a receiving inset therein;
 a fixture suitable for removable insertion to the receiving inset;
 a plurality of roller bearings interactively associated with the fixture, and which impart a low friction roll to at least a perimeter portion of the fixture; and
at least one guide on the frame suitable to at least partially positional maintain the circuit board associated with the fixture;
wherein the fixture rotates across the plurality of roller bearings to thereby rotate the circuit board about the receiving inset, and wherein the rotation variably associates radial aspects of the circuit board in proximity to at least one pick and place robot capable of placing ones of the components upon the circuit board particularly within specific ones of the radial aspects, wherein the plurality of roller bearings are active, and are actuated by at least one processing system executing non-transitory computing code from at least one computing memory.

7. The rotary table of claim 6, wherein the non-transitory computing code further controls the placing of the ones of the SMT components.

8. The rotary table of claim 1, wherein the plurality of roller bearings comprise a modular bearing plate removably associated to the fixture.

9. The rotary table of claim 8, wherein the modularity corresponds to ones of the circuit board having differences in size or shape.

10. The rotary table of claim 1, wherein the at least one guide is modular and removably associated with the frame.

11. The rotary table of claim 10, wherein the modularity corresponds to ones of the circuit board having differences in size or shape.

12. The rotary table of claim 1, further comprising at least one sensor suitable to track position of the radial aspects.

13. The rotary table of claim 12, wherein the at least one sensor comprises a circuit board indexer.

14. The rotary table of claim 12, wherein the at least one sensor comprises a plurality of support pin sensors.

15. The rotary table of claim 14, wherein the support pin sensors are corresponded to active aspects of the circuit board.

16. The rotary table of claim 1, wherein a center axis through the center of the circuit board is coaxial with a second center axis of the receiving inset, and wherein the coaxility is maintained through the rotation.

17. The rotary table of claim 1, wherein the rotation is through at least through 180 degrees.

18. The rotary table of claim 1, wherein the fixture and the frame include a handle suitable to receive a human hand therethrough for removal of the circuit board.

* * * * *